United States Patent [19]

Edelstein

[11] Patent Number: 4,620,155
[45] Date of Patent: Oct. 28, 1986

[54] NUCLEAR MAGNETIC RESONANCE IMAGING ANTENNA SUBSYSTEM HAVING A PLURALITY OF NON-ORTHOGONAL SURFACE COILS

[75] Inventor: William A. Edelstein, Schenectady, N.Y.

[73] Assignee: General Electric Company, Schenectady, N.Y.

[21] Appl. No.: 641,234

[22] Filed: Aug. 16, 1984

[51] Int. Cl.[4] ........................................... G01R 33/20
[52] U.S. Cl. ..................................... 324/322; 324/318
[58] Field of Search ............... 324/300, 307, 309, 311, 324/313, 314, 318, 319, 322

[56] References Cited

U.S. PATENT DOCUMENTS 3,427,532  2/1969  Nelson ................................. 324/322
4,052,661  10/1977  Higham et al. ...................... 324/322

Primary Examiner—Michael J. Tokar
Attorney, Agent, or Firm—Geoffrey H. Krauss; James C. Davis, Jr.; Marvin Snyder

[57] ABSTRACT

An NMR antenna subsystem has a plurality of co-planar surface coils, each comprised of a plurality of segments and elements for tuning the coil to resonance at the Larmor frequency of a nuclei specie to be investigated. Each coil has circuitry for selectively detuning that surface coil when at least one other one of the plurality of surface coils is in use. One of a pair of co-planar surface coils can be utilized for signal reception and includes a parallel-resonant detuning circuit which operates only when a relatively large magnitude RF signal is induced by an excitation signal in a second surface coil. The second surface coil includes a circuit for detuning that coil except when an externally-provided signal is present; this signal may be the RF excitation signal itself or another signal provided simultaneously with the RF excitation signal.

21 Claims, 4 Drawing Figures

U.S. Patent  Oct. 28, 1986  Sheet 1 of 2  4,620,155
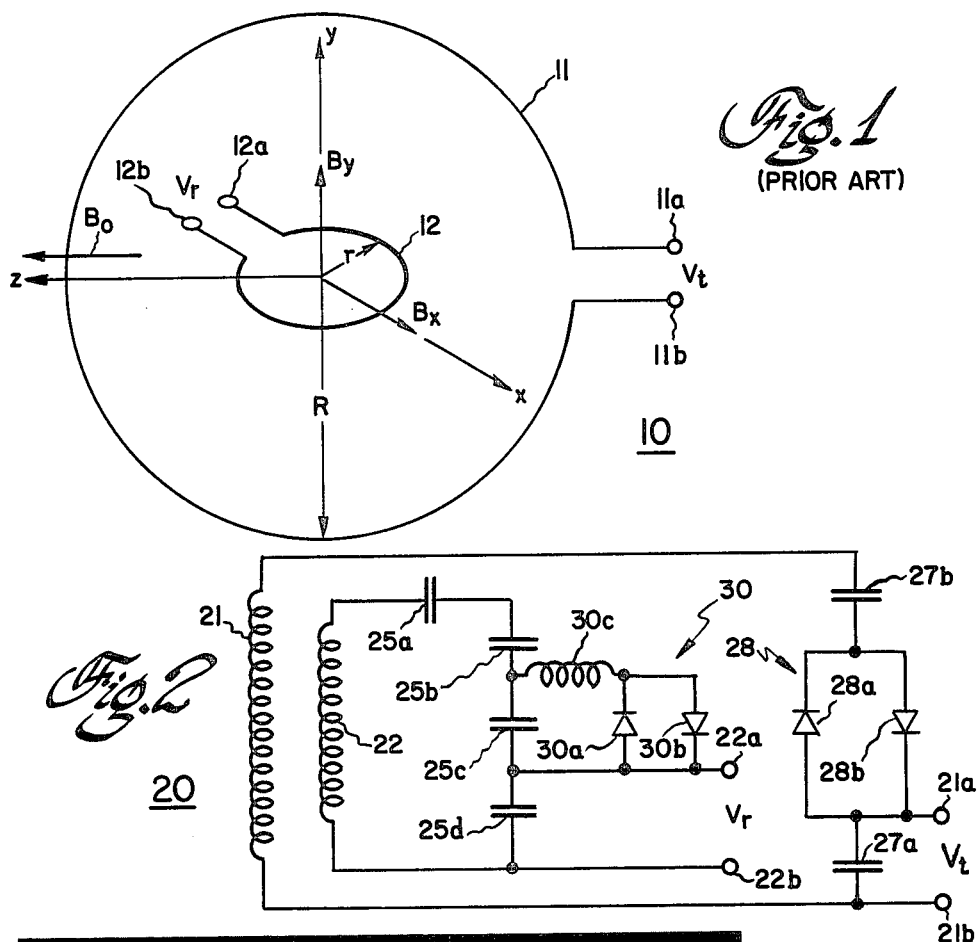
Fig. 1 (PRIOR ART)
Fig. 2
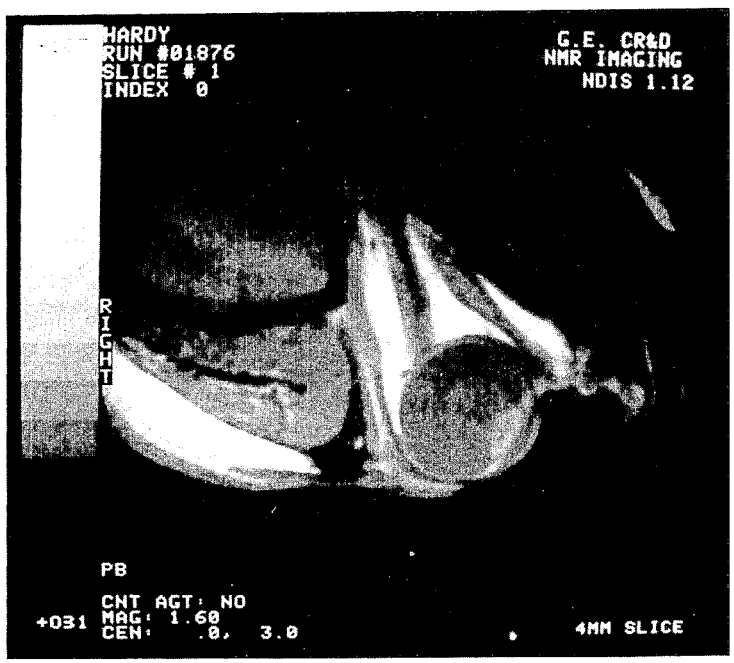
Fig. 4

NUCLEAR MAGNETIC RESONANCE IMAGING ANTENNA SUBSYSTEM HAVING A PLURALITY OF NON-ORTHOGONAL SURFACE COILS

BACKGROUND OF THE INVENTION

The present application relates to surface coil antennae for nuclear magnetic resonance imaging and, more particularly, to a novel nuclear magnetic resonance imaging antenna subsystem having a plurality of surface coils disposed in non-orthogonal relationship, and preferably in the same plane.

It is known to use a surface coil as a receiving antenna in an in vivo nuclear magnetic resonance (NMR) experiment; a surface coil is generally more sensitive to smaller volumes than the considerably larger volume coils typically utilized with head and/or body imaging NMR equipment. In the typical NMR experiment, the sample to be analyzed is immersed in a substantially homogeneous static magnetic field $B_O$, typically directed along one axis, e.g. the Z axis, of a three-dimensional Cartesian set of coordinates. Under the influence of the magnetic field $B_O$, the nuclei (and therefore the net magnetization M) of atoms having an odd-number of nucleons precess or rotate about the axis of the field. The rate, or frequency, at which the nuclei precese is dependent upon the strength of the applied magnetic field and on the nuclear characteristics. The angular frequency of precession $\omega$ is defined as the Larmor frequency and is given by the equation: $\omega = \gamma B_O$, in which $\gamma$ is the gyromagnetic ratio (constant for each type of nucleus). The frequency at which the nuclei precess is therefore substantially dependent on the strength of the magnetic field $B_O$, and increases with increasing field strength. Because the precessing nucleus is capable of absorbing and re-radiating electromagnetic energy, a radio-frequency (RF) magnetic field at the Larmor frequency can be utilized to excite the nuclei and receive imaging response signals therefrom. It is possible, by superimposing one or more magnetic field gradients of sufficient strength, to spread out the NMR signal spectrum of the sample and thereby distinguish NMR signals arising from different spatial positions in the sample, based on their respective resonant frequencies. Spatial positions of the NMR signals are determinable by Fourier analysis and knowledge of the configuration of the applied magnetic field gradient, while chemical-shift information can be obtained to provide spectroscopic images of the distribution of a particular specie of nucleus within the imaged sample.

For NMR imaging at relatively high static field $B_O$ magnitudes (typically in excess of 0.5 Tesla (T)), having associated Larmor frequencies greater than about 10 MHz., surface coils utilized as imaging or spectroscopy receiving antennae can be constructed with relatively high quality factor Q, such that most of the resistive loss in the receiving circuit originates in the in vivo tissue sample. This is particularly important as the sensitivity of the NMR experiment requires that the receiving antenna favor the NMR response signal from a particular small excited volume of the sample, while being relatively insensitive to noise currents flowing through the total capture volume of the receiving coil.

It is also known that the radio-frequency (RF) fields generated by a simple loop or spiral surface coil are highly non-uniform. The surface coil reception sensitivity, which is essentially the inverse of the excitation field generated during sample irradiation, is likewise non-uniform. Hence, a relatively large RF antenna is required for transmission excitation of the sample to produce a more uniform irradiating RF field. A relatively small, but sensitive, surface receiving coil is utilized with the larger-diameter exciting surface coil.

Hitherto, the requirements for a relatively small-diameter receiving surface coil and a relatively large-diameter exciting surface coil has typically required that the NMR system antennae apparatus 10 (see FIG. 1) position the larger-radius R excitation antenna 11 in a first plane, e.g. in the Y-Z plane (for a three-dimensional Cartesian coordinate system having the NMR static imaging field $B_O$ directed in the Z direction), and position the receiving antenna 12, having a diameter r no greater than one-half the exciting antenna radius R, in a second plane, e.g. the X-Z plane, essentially orthogonal to the exciting transmitter first plane, e.g. the Y-Z plane. The essentially orthogonal placement of the exciting and receiving coils 11 and 12 is based upon several phenomena: the need to prevent currents (induced in the receiving coil during the presence of an irradiating RF magnetic field $B_x$, e.g. in the X direction, for the illustrated transmitting coil in the Y-Z plane) from damaging the sensitive reception preamplifier, typically connected to receive coil terminals 12a and 12b to receive the induced reception signal voltage $V_r$ thereat; the need to prevent the currents induced in surface coil 12 from, in turn, producing an RF magnetic field $B_y$ which would have a component in the X direction if the receive coil 12 were not situated exactly in the X-Z plane and which would cancel out a portion of the excitation magnetic field $B_x$; and the need to avoid the electrical coupling of transmitting coil 11 to receiving coil 12 after the excitation of the sample. The currents induced in reception coil 12 can be prevented from damaging the receive coil preamplifier by utilizing resonant circuitry, as at terminals 12a and 12b, to isolate the subsequent preamplifier (not shown) during periods when a large magnitude of an excitation voltage $V_t$ is present at the terminals 11a and 11b of the transmitting antenna. However, the production of an induced RF magnetic field has hitherto only been reduced by the aforementioned essentially orthogonal placement of the two surface coils 11 and 12, and the art has not otherwise considered the problem of surface coil-to-surface coil coupling in the receive mode, which coupling causes criticality in the tuning adjustments of receiving coil 12 due to the relative orientation of coils 11 and 12 and can induce additional noise in the receiving antenna 12 caused by noise currents in the transmitting coil 11.

It is especially desirable, to facilitate placement of the antennae during in vivo imaging of a portion of the human anatomy, to have both the transmission excitation surface coil antenna 11 and the response signal receiving antenna 12 in a substantially planar configuration as, for example, described and claimed in application Ser. No. 641,540, filed on even date herewith, assigned to the assignee of the present application and incorporated herein in its entirety by reference. A highly desirable NMR imaging antenna has at least two surface coils, at least one of which is utilized for excitation signal transmission and at least one other one of which is utilized for response signal reception, but which are so decoupled as to be devoid of induced counter fields during excitation irradiation and to be devoid of damping and other deleterious effects during image signal reception.

BRIEF SUMMARY OF THE INVENTION

In accordance with the invention, an NMR antenna subsystem has a plurality of co-planar and substantially concentric surface coils, each comprised of a plurality of segments having means interposed between segments for tuning, in conjunction with distributed capacitances, the surface coil to resonance at the Larmor frequency of a nuclei specie to be investigated. Each coil has means, interposed between adjacent ends of a pair of consecutive segments, for selectively detuning that surface coil when at least one other one of the plurality of surface coils is in use; the detuned coil has substantially no effect upon the at least one other co-planar coil.

In a presently preferred embodiment, the subsystem comprises a pair of co-planar surface coils. A first surface coil, of smaller effective radius, is utilized for signal reception and includes a parallel-resonant detuning circuit which operates only when either a switching signal is applied or a relatively large magnitude RF signal is induced in the first surface coil by an excitation signal in a second surface coil, having a larger effective radius than, and surrounding, the first surface coil. The second surface coil includes means for detuning that coil except when an externally-provided signal is present; this signal may be the RF excitation signal itself or another signal provided simultaneously with the RF excitation signal.

Accordingly, it an object of the present invention to provide a novel NMR imaging antenna subsystem having a plurality of non-orthogonal, co-planar surface coils.

This and other objects of the present invention will become apparent to those skilled in the art upon reading the following detailed description, when considered in conjunction with the drawings.

BRIEF DESCRIPTION OF THE DRAWINGS

FIG. 1 is a perspective view of an orthogonal two-surface-coil antennae apparatus as utilized in the prior art;

FIG. 2 is a schematic diagram of a substantially co-planar NMR surface coil antennae subsystem having a plurality of non-orthogonal surface coils, in accordance with the principles of the present invention;

FIG. 4 is a photograph illustrating an image of the ocular area of a human volunteer, obtained with the novel surface coil antenna subsystem of the present invention.

DETAILED DESCRIPTION OF THE INVENTION

Figure 3:
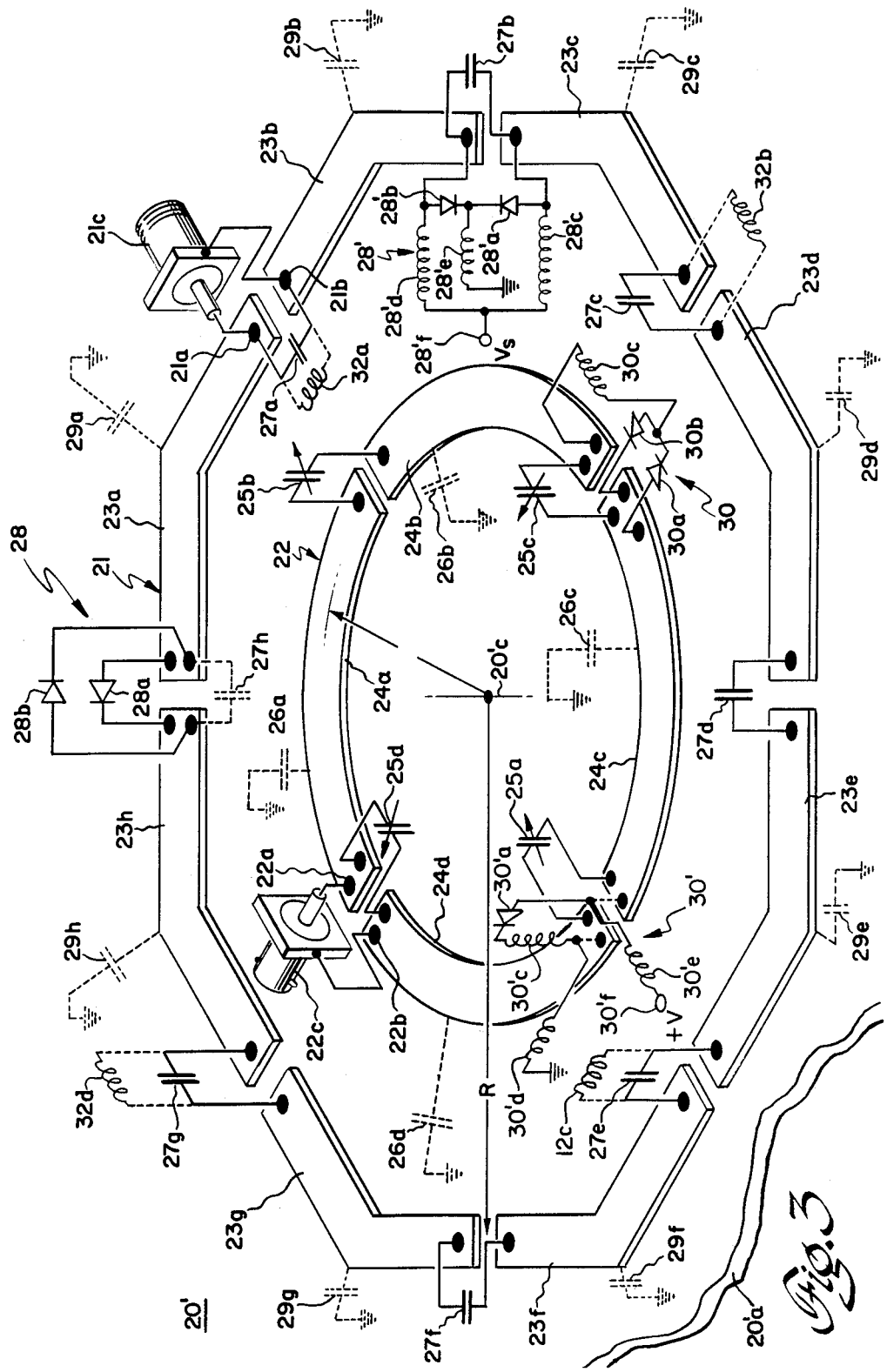
FIG. 3 is a perspective view of a presently preferred embodiment of the non-orthogonal surface coil antennae subsystem of FIG. 2, and is useful in understanding several principles of the present invention, including alternative switching, tuning and other functional implementations therefor.

Referring now to FIGS. 2 and 3, a surface coil antennae subsystem 20 or 20' comprises at least two separate surface coils, such as first surface coil 21 and second surface coil 22. The surface coils may be formed upon a suitable insulative substrate 20'a, which may have flexibility properties tailored to allow the co-planar surface coils 21 and 22 to be contoured to the exterior surface of a sample to be investigated by NMR experiments. Each surface coil 21 or 22 is formed of a plurality N of segments, with the respective surface coil conductor segments 23 or 24 having straight, angulated or continuously curved peripheries, as shown by the angulated segments 23a-23h of the octogonal-shaped first, outer surface coil 21 (with N=8) or the continuously-curved arcuate segments 24a-24d of the second, inner surface coil 22 (with N=4). Advantageously, for use with first surface coil 21 acting as an exciting transmission antenna for a nuclei specie providing a re-radiated signal received by second surface coil 22, the average equivalent radius R of the larger surface coil will be at least twice the average equivalent radius r of the smaller surface coil 22.

Each of the N surface coil segments 23 or 24 has the ends thereof separated from the adjacent ends of other segments 23 or 24 of the like surface coil. That one of coils 21 and 22 intended for use as a reception coil has one of a plurality N of capacitive coupling elements coupled across each of the N gaps between adjacent segments thereof; thus, reception coil 22 has (N=4) coupling capacitors 25a-25d individually coupled between adjacent ends of different ones of the N=4 segments 22a-22d. Each of capacitors 25 is advantageously of variable value, selected to resonantly-tune the coil 22 to the Larmor frequency of the nuclei to be investigated. A plurality of capacitive elements is desirable to negate the effects of the parasitic capacitances 26a-26d, which are themselves capable of random variations. The received signal is provided between coil ends 22a and 22b to connector 22c.

The surface coil intended for use as an excitation coil has one of a plurality M=(N−1) of capacitive element 27a-27g individually connected across all but one of the intersegment gaps. Thus, each of coupling elements 27a-27g is connected across one of the gaps between the adjacent ends of respective segments 23a-23h of coil 21, except for the gap between adjacent ends of segments 23a and 23h. An additional, or N-th, equivalent capacitive element, e.g. capacitive element 27h (shown in broken line), may be provided only by the parasitic capacitance of a first switching means 28. Capacitances 27 may be fixed or variable and are selected to tune, when means 28 provides a substantially low-impedance, e.g. short, circuit between the ends of segments 23a and 23h, the coil to the desired excitation frequency, in conjunction with the second coil segment parasitic capacitances 29a-29h. Each parasitic gap capacitance 27 is preferably of relatively small value, to detune the large surface coil away from the desired frequency when means 28 is in a non-conductive (high impedance, or open circuit) condition.

Means 28 can be any selective-conduction network, such as is illustratively provided by unidirectionally-conducting elements 28a and 28b. Elements 28a and 28b can be a pair of anti-parallel-connected diodes, if the magnitude of the RF excitation signal voltage expected across the diodes is sufficiently large and the diode speed is sufficiently fast to cause each diode to conduct for an appreciable portion of an RF signal half-cycle. As it is one continuing objective of NMR research to reduce the magnitude of the RF excitation signal used in in vivo experiments, certain excitation sequences or power levels may be of inadequate magnitude to cause diodes 28a and 28b to be rendered self-conductive during the excitation portion of an imaging sequence. An alternative selective-conduction network 28' may then be required, to provide a low-impedance condition between the ends of two adjacent segments, during excitation signal transmission and to provide a high-impedance condition at other times. If network 28' is present, means 28 and capacitance 27b are removed and capacitance 27h is provided. Means 28' utilizes a pair of RF switching elements 28'a and 28'b, which may be of the voltage-controlled type, such as varactor diodes and the like, or may be of the currentcontrolled type, such as P-I-N diodes and the like, to provide the required low-impedance connection between the two adjacent ends of a chosen pair of segments, e.g. segments 23b and 23c in the illustrated example, responsive to an external signal, e.g. switching signal $V_S$, which is provided at least during each time interval when an excitation signal is applied to the surface coil ends 21a and 21b, via connector 21c. Illustratively, means 28' has a pair of P-I-N diodes 28'a and 28'b in series-connection between the ends of segments 23b and 23c; the common cathodes of the two diodes are returned to D.C. common potential through a first RF choke coil 28'c, while each diode anode is connected via another RF choke 28'd or 28'e to a positive switching control voltage $V_s$ input 28'f. If use of a negative $V_s$ input voltage is desired, the polarity of both diodes 28'a and 28'b must be reversed. In either case, it will be seen that, in the absence of signal $V_s$, the diodes are in an essentially non-conductive condition and, as capacitance 27b is then only the small parasitic capacitance of the non-conducting diodes, the larger surface coil 21 is not resonant and does not appreciably couple to the smaller surface coil 22. When signal $V_s$ is present, a low impedance appears between the ends of segments 23b and 23c, effectively completing the coil; the capacitances 27a, 27c–27h and 29a–29h tune the now-complete coil to resonance at the Larmor frequency of the excitation signal.

Means 30, present across one intersegment gap of each surface coil used for signal reception, provides a parallel-resonant "trap" circuit, for detuning the reception surface coil and substantially preventing the presence of excitation-frequency signals at the reception surface coil output, response to induction of a signal in the reception surface coil at the resonant Larmor frequency of the trap circuit. Means 30' provides the same "trap" action, responsive to an external signal, as an alternative to means 30. Thus, reception surface coil 22 has a detuning means 30 or 30' across the gap between two adjacent segments, e.g. between segments 24b and 24c or between segments 24c and 24d. Means 30 includes an induced-signal sensing means, such as antiparallel-connected diodes 30a and 30b, for providing a low-impedance circuit only if a signal of sufficiently hazardous magnitude (e.g. greater than some few tenths of a volt, peak) is induced in surface coil 22. Means 30 also includes a reactive element which is switched into parallel connection across the gap responsive to the low-impedance condition obtaining in the sensing diodes 30a and 30b; this reactance is of opposite sign to the reactance of the tuning element across the same intersegment gap, and of a value selected to parallelly resonate with the intergap impedance at the Larmor frequency of an associated excitation surface coil antenna. Means 30' utilizes an externally-controlled detuning means, e.g. a P-I-N diode 30'a, which is in RF series-connection with reactive element 30'c across capacitance 25a; a pair of RF chokes 30'd and 30'e are effectively in series with the diode between ground potential and an input terminal 30'f, to allow the diode to conduct (and place element 30'c across capacitor 25a) responsive to an externally-supplied signal, e.g. a voltage +V, being provided at input terminal 30'f. Thus, where (as illustrated) the tuning impedance element across the associated gap is a capacitance 25c or 25a, the impedance element 30c or 30'c is an inductance, of value L aproximately given by: $L=(2\pi f_L)^{-2}/C$, where $f_L$ is the Larmor frequency to be excited by the associated excitation surface coil 21 and C is the value of capacitor 25c or 25a. Inductor 30c or 30'c will advantageously be of a value and position such that it has minimal coupling to either reception or excitation surface coils; a toroidal inductor or an inductance formed by a shorted length of coaxial cable, is preferred for avoiding this undesired inductive coupling. It will be understood that the actual value of both capacitor 25c or 25a and inductor 30c or 30'c must be adjusted in situ, respectively, with no excitation present and with excitation present in coil 21, to account for the effects of parasitic impedance of the non-ideal diodes used for switching elements 30a and 30b or element 30'a. Similarly, the value of at least one of capacitances 27 of excitation coil 21 may require adjustment due to the parasitic impedance of the non-ideal switching diodes 28a and 28b, 28'a and 28'b or 30'a. It should also be understood that if surface coils for several different frequencies are "stacked" (as described in the abovementioned co-pending application) to allow simultaneous or sequential NMR experimentation with different species of nuclei, then each coil (either excitation or reception) may require a parallel-resonant trap circuit for each of the total number of involved Larmor frequencies, to prevent induced effects between the various coils if the coil locations and Larmor frequencies are such that coupling is possible. Such additional traps can be provided by one or more additional inductances 32a–32d, each in parallel connection with an associated one of capacitors 27a, 27c, 27e and/or 27g and tuned to the required frequency. Either or both of coils 21 and/or 22 can have additional trap circuits; the values of capacitance in parallel with each trap inductance 32 may, but need not, be of similar magnitude and the value of those capacitors not bridged by a trap inductance can be the same as, or different than, both the trap capacitors, or each other. In generally, similar values may be used to provide a symmetrical radiation/sensitivity pattern to each surface coil antenna, although it should be understood that some NMR experiments may require use of non-identical impedances in any of impedance elements 25, 27, 30 and/or 32, to obtain a particular required antenna characteristic.

Referring now to FIG. 4, a photograph of a $^1$H image of an axial section of a human volunteer, as imaged with a surface coil subsystem in accordance with the present invention, is shown. The clarity of the details of the human eye and brain, in this 4 mm. thick slice, illustrate the substantial non-interaction of the co-planar antennae of the present invention. The imaging antenna subsystem comprised a single-loop reception coil 22, of about 5 centimeters median radius r, having an inductance of about 190 nanohenries and four segments 24; four capacitors 25 of about 130 picofarads each were used, for $^1$H imaging at a Larmor frequency of about 63.5 MHz. in a system having a static field $B_O$ of about 1.5 Tesla. Diodes of the 1N4608-type were used, with a two-turn, 12 millimeter diameter inductance 30c, positioned such that its axis was substantially perpendicular to the common plane of the surface coils. The excitation coil was of eight-segment octogonal shape, having a median spacing of about 25 centimeters between opposite sides and a loop inductance of about 60 nanohenries. Capacitors 27 were about 82 picofarads. Means 28 comprised a pair of Unitrode UM6201-B P-I-N diodes.

While several presently preferred embodiments of my novel NMR imaging antenna subsystem with a plurality of non-orthogonal surface coils have been described herein, many modifications and variations will now become apparent to those skilled in the art. For example, other non-orthogonal coil systems, such as one having a volume excitation coil and a surface reception coil, can be equally as well utilized with the detuning means of the present invention. It is my intent to be limited only by the scope of the appending claims and not be the specific details and instrumentalies presented by way of explanation and illustration herein.

What I claim is:

1. An antenna subsystem for use in magnetic resonance imaging of selected nuclei in a sample, comprising:
    a plurality of substantially planar surface coil antennae disposed with the planes thereof in a non-orthogonal registered relationship;
    first means, forming a portion of each of said surface coil antennae to be uitlized for sample excitation with an externally-provided radio-frequency (RF) excitation signal, for causing the associated surface coil antenna to be resonant, at the Larmor frequency of the selected nuclei, responsive only to an externally-provided switching signal; and
    second means, forming a portion of each of said surface coil antennae to be utilized for response signal reception, for detuning the associated surface coil antenna at least when a radio-frequency signal is induced therein by the RF excitation signal in one of said excitation antennae.

2. The antenna subsystem of claim 1, wherein said externally-provided switching signal is the radio-frequency excitation signal itself.

3. the antenna subsystem of claim 2, wherein each excitation surface coil antenna comprises a conductive member having at least one gap formed therein; and said first means comprises: at least one switching element connected between adjacent conductive member ends defining a selected one of said at least one gap, the at least one switching element being (1) enabled to a relatively low impedance condition responsive to the presence of said externally-provided radio-frequency signal at said excitation surface coil and (2) disabled to a relatively high-impedance condition responsive to the absence of said externally-provided radio-frequency signal at said excitation surface coil antenna.

4. The antenna subsystem of claim 3, wherein said at least one switching element comprises a pair of antiparallel-connected diodes coupled across said selected gap.

5. The antenna subsystem of claim 1, wherein said externally-provided switching signal is a signal different from said radio-frequency excitation signal.

6. The antenna subsystem of claim 5, wherein each of said excitation surface coil antennae comprises a conductive member having at least one gap formed therein; and said first means comprises: at least one switching element connected across one conductive member gap and responsive respectively to the presence and absence of an electrical parameter for attaining respective low-impedance and high-impedance conditions; means for receiving the externally-provided switching signal; and means for connecting the switching signal receiving means to said at least one switching element to cause said switching element to switch between said low-impedance and high-impedance conditions responsive to selected ones of the presence and absence of said switching signal.

7. The antenna subsystem of claim 6, wherein said at least one switching element is at least one varactor diode and said switching signal is a switching voltage.

8. The antenna subsystem of claim 6, wherein said at least one switching element is at least one P-I-N diode and said switching signal is a switching current.

9. The antenna subsystem of claim 1, wherein a pair of non-orthogonal surface coil antennae are co-planar to one another.

10. The antenna subsystem of claim 9, wherein the centers of the pair of surface coil antennae are substantially identical.

11. The antenna subsystem of claim 9, further comprising an insulative substrate supporting said pair of surface coils upon a surface thereof.

12. The antenna subsystem of claim 1, wherein each of said plurality of surface coil antennae comprises; a plurality of conductive segments arranged with each of a like plurality of intersegment gaps between adjacent pairs of segments; and further including at least one reactive means coupled across at least one intersegment gap for tuning the associated surface coil antenna to the Larmor frequency of a nuclei species to be imaged with said subsystem.

13. The antenna subsystem of claim 12, wherein at least one of the at least one reactive means is a variable reactance.

14. The antenna subsystem of claim 13, wherein the variable reactance is a variable capacitive reactance.

15. The antenna subsystem of claim 12, wherein said at least one reactive means is a capacitive element.

16. The antenna subsystem of claim 15, wherein an inductive element is coupled in parallel with at least one of the capacitive elements, the inductive element having an inductive reactance selected to resonate with the reactance of the associated capacitive element at a predetermined frequency.

17. The antenna subsystem of claim 16, wherein the predetermined frequency is different than the Larmor frequency to which the surface coil antenna is tuned.

18. The antenna subsystem of claim 1, wherein each signal reception antennae comprises a conductive member having at least one gap formed therein; and said second means comprises: an element of a first impedance type connected across said gap; an element of a second impedance type, of magnitude selected to resonate with said first impedance element at the Larmor frequency of the signal provided to the associated excitation antenna; and means, connected in series with said second impedance element across said gap, for selectively connecting said second impedance element in parallel with said first impedance element responsive only to said radio-frequency signal induced in said reception antenna.

19. The antenna subsystem of claim 18, wherein said first reactive element is a capacitive element; and said said second reactive element is an inductive element.

20. The antenna subsystem of claim 19, wherein said connecting means comprises a pair of unidirectionally-conducting switching elements coupled in antiparallel connection between one gap-forming end of said conductive member and that end of said second impedance element furthest from the end thereof connected to the other gap-forming end of said conductive member.

21. The antenna subsystem of claim 19, wherein said connecting means comprises: at least one switching element coupled between one gap-forming end of said conductive member and that end of said second impedance element furthest from the end thereof connected to the other gapforming end of said conductive member and responsive to the presence or absence of a control signal for providing an associated low-impedance or high-impedance condition between said ends; and means for providing said control signal to said switching element from a source external to said antenna subsystem.

* * * * *